United States Patent
Newton et al.

(10) Patent No.: US 7,293,247 B1
(45) Date of Patent: Nov. 6, 2007

(54) ENCAPSULATING PARAMETERIZED CELLS (PCELLS)

(75) Inventors: Jim Edward Newton, Munich (DE); Christian Scheiba, Holzkirchen (DE)

(73) Assignee: Cadence Design Systems, Inc., San Jose, CA (US)

( * ) Notice: Subject to any disclaimer, the term of this patent is extended or adjusted under 35 U.S.C. 154(b) by 858 days.

(21) Appl. No.: 10/613,403

(22) Filed: Jul. 2, 2003

Related U.S. Application Data

(60) Provisional application No. 60/394,108, filed on Jul. 2, 2002.

(51) Int. Cl.
  *G06F 17/50* (2006.01)
(52) U.S. Cl. .............. 716/2; 716/5; 716/7; 703/14
(58) Field of Classification Search .............. 716/2, 716/4, 5, 7; 703/14
  See application file for complete search history.

(56) References Cited

U.S. PATENT DOCUMENTS

| | | | |
|---|---|---|---|
| 6,011,911 A * | 1/2000 | Ho et al. ............ | 716/5 |
| 6,370,677 B1 * | 4/2002 | Carruthers et al. ......... | 716/8 |
| 6,381,563 B1 * | 4/2002 | O'Riordan et al. .......... | 703/14 |
| 6,405,351 B1 * | 6/2002 | Steiss et al. ............ | 716/5 |
| 6,530,072 B1 * | 3/2003 | Hagerman et al. .......... | 716/18 |
| 6,574,779 B2 * | 6/2003 | Allen et al. ............ | 716/1 |
| 6,577,992 B1 * | 6/2003 | Tcherniaev et al. ......... | 703/14 |
| 6,691,301 B2 * | 2/2004 | Bowen ............... | 717/114 |
| 6,718,520 B1 * | 4/2004 | Merryman et al. ......... | 716/1 |
| 6,836,877 B1 * | 12/2004 | Dupenloup ........... | 716/18 |
| 7,143,021 B1 * | 11/2006 | McGaughy et al. ......... | 703/14 |
| 2005/0149311 A1 * | 7/2005 | McGaughy ............ | 703/14 |
| 2005/0149312 A1 * | 7/2005 | McGaughy ............ | 703/14 |
| 2006/0059443 A1 * | 3/2006 | Kauth et al. ........... | 716/2 |

OTHER PUBLICATIONS

NN8809135, "Extended Range for Macro Parameters", IBM Technical Disclosure Bulletin, vol. 31, No. 4, p. 135 (2 pages), Sep. 1988.*
Cadence "Cell Design Tutorial" Title Page, Table of Contents, Chapters 5 and 6, Jun. 2000, Cadence Design Systems, Inc., San Jose, CA, pp. 1-6, 131-195.
Cadence "Virtuoso Parameterized Cell Reference" 1999, 35 pgs., Cadence Design Systems, Inc., San Jose, CA.
Barnes, T.J. "SKILL: A CAD System Extension Language" Proceedings of the 27th ACM/IEEE Design Automation Conference, Orlando, FL, Jun. 24-28, 1990, pp. 266-271.
Jingnan, X. et al. "A SKILL-based Library for Retargetable Embedded Analog Cores" Proceedings of the Conference on Design, Automation and Test in Europe, Munich, Germany, 2001, pp. 768-769.
Zaman, M.H. et al. "An Environment for Design and Modeling of Electro-Mechanical Micro-Systems" Journal of Modeling and Simulation of Microsystems, 1999, vol. 1, No. 1, pp. 65-76, located at http://www.conventor.com/media/papers/jmsm_1999.pdf.

* cited by examiner

*Primary Examiner*—Phallaka Kik
(74) *Attorney, Agent, or Firm*—Bingham McCutchen LLP

(57) ABSTRACT

A method for encoding elements of an electronic design generates a flattened hierarchy of a parameterized cell of the electronic design, selects common and unique parameters of each element in the parameterized cell, and generates a physical design quantization characteristic value from the selected common and unique parameters.

18 Claims, 7 Drawing Sheets

```
COPY FLATTENED HIERARCHY OF THE
PCELL TO A TEMPORARY WORKSPACE
                 110
                  ↓
COMPRESS THE FLATTENED HIERARCHY
OF THE CELL INTO PDQ DATA STRUCTURES
    BY A GEOMETRY-BASED PROCESS
                 120
                  ↓
APPLY AN ARRAY RECOGNITION PROCESS
     TO THE PDQ DATA STRUCTURE
                 130
```

ENCAPSULATING PARAMETERIZED CELLS (PCELLS)

CROSS-REFERENCE TO RELATED APPLICATION

This application claims the benefit of U.S. Provisional Application No. 60/394,108, filed Jul. 2, 2002, which is hereby incorporated by reference in its entirety.

FIELD OF THE INVENTION

The present invention relates to the field of electronic circuit design and manufacturing.

BACKGROUND OF THE INVENTION

Circuit designers can create a design using a graphical tool to generate circuit components. In a parameterized cell (pcell), a designer selects parameters to describe features of electronic components for a design of an integrated circuit. The pcell tool can then automatically generate multiple representations of the electronic components of the pcell based on the parameters. The parameterized data specified by the user minimizes the effort of data entry and editing in the design tool, and also reduces design rule violations.

Any kind of layout data can be parameterized. For example, with a transistor pcell, the length, width, number of gate segments, and other design elements of the transistor, can be realized by simply inserting or changing one or more parameter values. For bipolar designs, parameterized data can include shapes such as arcs and circles. Design data can include text, and the location of the text may be relative to a virtual shape. Also, pieces of parameterized data can automatically appear, disappear, or replicate as a condition of another parameter.

To generate a pcell instance, a library name, cell name, instance name, orientation, and the type and values of parameters are specified. The pcell includes a formal parameter table where each row of the table contains a pcell parameter name, parameter type (such as float, integer, Boolean, or string), and a default value. The parameters for a resistor may include L, which specifies a length of a resistor segment; fingers, which specifies the number of fingers of the resistor; and q, which specifies a length of first and last connecting wires, for example.

The parameters may also be used to set a size of each parameterized cell shape (pshape). The parameters may be included in an expression having constants, formal parameters, and design rule identifiers. If a length or a width of a rectangle is not provided, a value may be found by searching through design rules. This may also be done to find values for a width of a path, a sub-path, or an arc. For example, a design rule may select the parameter for a poly width based on a design rule that determines minimum poly width.

A reference point is used to determine an initial location of a pcell. For example, a starting point of a pcell may be identified with specific coordinates, or a default starting point of (0, 0) may be used. The pshapes within a pcell can include alignment points such as, for example, vertices or a path centerline of a pshape, to align two pshapes in the pcell.

Traditional graphical tool systems draw the pcell according to its pcell parameters by executing code of a software program, such as SKILL code for example. The resulting pcell produced by the pcell code is considered as correct by definition. Moreover, if a parameter changes after this cell is created, the design system automatically triggers the recalculation of the shapes within the cell, and does so correctly (by definition). The pcell can then viewed from a higher level of the design hierarchy as a cell instance of the chip design.

However, the software program used to draw the pcell may have long or complicated algorithms which are inefficient. For example, if the pcell software program, when executed, references other pcell parameters, design rules, and connectivity models, drawing the pcell may be time consuming. Therefore, there is a need for an efficient method of drawing pcells.

SUMMARY OF THE INVENTION

A method for encoding elements of an electronic design generates a flattened hierarchy of a parameterized cell of the electronic design, selects common and unique parameters of each element in the parameterized cell, and generates a physical design quantization characteristic value from the selected common and unique parameters.

DETAILED DESCRIPTION

Figure 1:
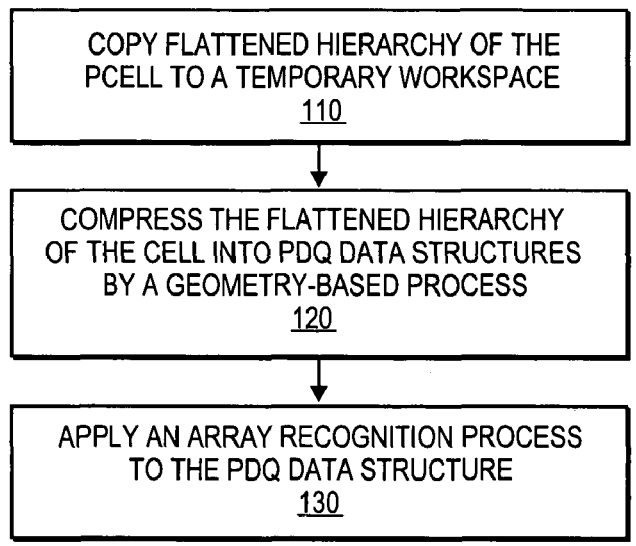
FIG. 1 shows an example of a method of creating a PDQ characteristic value for a pcell.

A graphical tool for designing an integrated circuit includes a method of generating a compressed representation of elements in a parameterized cell (pcell) of the design. The parameters common to instances of a shape in the pcell are stored in a shared field of a characteristic value data structure, and parameters unique to each instance of the shape are stored in individual fields. Also, shape instances that form an array within the pcell can be recognized, and an amount of information to represent them can be further reduced in the characteristic value data structure.

A Physical Design Quantization (PDQ) technique can be integrated into a pcell design tool to generate the characteristic value data structure, so that each pcell variant builds itself according to this fixed characteristic data structure that provides the PDQ Characteristic Value. Therefore, each pcell is drawn with reference to the PDQ characteristic value, instead of with reference to other pcell parameters, design rules, or connectivity models. This value is the same for every pcell view which is mask-wise identical, and contains enough information to completely regenerate the cell view. The characteristic value is relatively easy to parse, and uses a relatively small portion of the total memory storage of the design system.

Examples of the PDQ Characteristic Value

The examples of Tables 1 and 2 depict characteristic values for two pcells, one small and one large. The data size of the characteristic value for the large case of Table 2 is not much larger than that of the small case shown in Table 1. The data structure of Table 1 shows the content of a PDQ Characteristic Value for a pcell master cell view containing two different geometries, a path geometry and a rectangle geometry. The data structure has a separate partition for each geometry. The path partition describes two paths, and the rectangle partition describes ten rectangles. Each path entry contains a layer-purpose pair, a path width (W), a path style, a path starting point $(x_1, y_1)$ and a path end point $(x_2, y_2)$. The layer-purpose pair, width, and style are common parameters of each path shape, because these parameters are the same for each instance of the path shape.

The starting and end points are unique to each instance of the shape of the path. Each rectangle entry has common parameters including a layer-purpose pair, rectangle length and width (L, W); and uniqueness parameters for each instance of the rectangle shape, which, for this example, is the lower left-hand corner coordinate $(x_{llc}, y_{llc})$ of each instance. The ten rectangles of Table 1 are represented with eight entries, because rectangle shape numbers 7 and 8 each contain lower left-hand coordinates for two instances of the same rectangle shape. (Similar structures are generated for polygons and labels as discussed below).

PDQ Characteristic Value for ("I1953" "t110d" "nflo_p" "layout")

data size for holding this PDQ Characteristic Value=539

"partition for path geometry"

TABLE 1

| | "partition for path geometry" | | | | | | | |
|---|---|---|---|---|---|---|---|---|
| path | common parameters of the shape | | | | unique para. of each shape inst. | | | |
| shape no. | layer purpose | W | Style | $x_1$ | $y_1$ | $x_2$ | $y_2$ | |
| 1 | (("MO" "drawing") | 0.22 | "truncateExtend" | ((0.17 | 0.02) | ((0.17 | −4.69))) | |
| 2 | (("text" "drawing1") | 0.14 | "truncateExtend" | ((0.17 | −0.1) | ((0.17 | −4.57))) | |

| | "partition for rectangle geometry" | | | | | | | |
|---|---|---|---|---|---|---|---|---|
| rect. | common parameters of the shape | | | unique param. of each shape instance | | | | |
| shape no. | layer purpose | L | W | $x_{llc}$ | $y_{llc}$ | $x_{llc}$ | $y_{llc}$ | |
| 1 | (("text" "drawing") | (0.05 | 0.05) | (0.03 | −0.08)) | | | |
| 2 | (("instance" "drawing") | (2.62 | 4.67) | (0.0 | −4.67)) | | | |
| 3 | (("ND" "drawing") | (2.05 | 4.67) | (0.33 | −4.67)) | | | |
| 4 | (("ND" "drawing") | (0.33 | 4.67) | (0.0 | −4.67)) | | | |
| 5 | (("ND" "drawing") | (0.24 | 4.67) | (2.38 | −4.67)) | | | |
| 6 | (("GC" "drawing") | (2.05 | 5.27) | (0.33 | −4.97)) | | | |
| 7 | (("GC" "drawing") | (2.05 | 0.2) | (0.33 | −4.92) | (0.33 | −4.67)) | |
| 8 | (("CD" "drawing") | (0.14 | 2.06) | (0.1 | −4.57) | (0.24 | −4.57)) | |

In most cases, a pcell master with a very large number of shapes can contain a high amount of regularity within it. For example, if a pcell contains multiple rectangles, and each rectangle has similar parameters, a PDQ Characteristic Value can describe the repetition of the rectangle using an array partition, as shown in Table 2. Each array entry contains a layer-purpose pair; the array starting point, which, in this example, is the x and y coordinate of the lower left hand corner of the array $(x_a, y_a)$; the x and y pitch within the array (dx, dy); the width and height of the rectangle which is arrayed (W, H), and the number of rows and columns contained in the rectangular array (row, col). Remaining shapes that are not described in the arrays may be described individually, as shown in the rectangle partition of Table 2.

PDQ Characteristic Value for ("I1976" "t110d" "nflo_p" "layout")

data size for holding this PDQ Characteristic Value=549

TABLE 2

"array partition"

| array no. | layer purpose | $x_a$ | $y_a$ | dx | dy | W | H | row | col |
|---|---|---|---|---|---|---|---|---|---|
| 1 | (("text" "drawing1") | 0.1 | −7.4 | 5.32 | 0.0 | 0.14 | 7.3 | 1 | 61) |
| 2 | (("M0" "drawing") | 0.06 | −7.52 | 5.32 | 0.0 | 0.22 | 7.54 | 1 | 61) |
| 3 | (("GC" "drawing") | 0.33 | −7.8 | 5.32 | 0.0 | 5.0 | 8.1 | 1 | 60) |
| 4 | (("GC" "drawing") | 0.33 | −7.75 | 5.32 | 7.8 | 5.0 | 0.2 | 2 | 60) |
| 5 | (("CD" "drawing") | 0.1 | −7.4 | 5.32 | 1.91 | 0.14 | 1.57 | 2 | 61) |
| 6 | (("CD" "drawing") | 0.1 | −3.57 | 5.32 | 1.91 | 0.14 | 1.56 | 2 | 61) |

"rectangle partition"

| rect. shape no. | common parameters | | | unique parameters | | | |
|---|---|---|---|---|---|---|---|
| | layer purpose | L | W | $x_{11c}$ | $y_{11c}$ | $x_{11c}$ | $y_{11c}$ |
| 1 | (("text" "drawing") | ( 0.05 | 0.05) | (0.03 | −0.08)) | | |
| 2 | (("ND" "drawing") | (318.88 | 7.5) | (0.33 | −7.5)) | | |
| 3 | (("ND" "drawing") | ( 0.33 | 7.5) | (0.0 | −7.5) | (319.21 | −7.5)) |

PDQ Methods

Methods to perform property creation, array recognition, and shape creation decoding are used to generate and process the PDQ data structure for a pcell.

An example of a method for encoding a PDQ characteristic value is shown in FIG. 1. A flattened hierarchy of the pcell is copied to a temporary workspace, 110. The flattened hierarchy of the cell is compressed into a PDQ data structure by selecting common and unique parameters of each element in the pcell, 120. An array recognition process is applied to the PDQ data structure, 130.

In one embodiment, the PDQ structure is generated in a deterministic, sorted way, such that cell views which are geometrically equivalent produce the same data structure, regardless of the order that the shapes are stored in the cell view. This allows cell views which appear identical with respect to layers and shapes to produce the same PDQ characteristic value. For example, a PDQ data structure can be partitioned so that the partitions represent each type of geometry in the cell, such as labels, polygons, paths which do not look like rectangles, paths which look like rectangles, and rectangles, for example.

The compression process 120 in the PDQ encoding method differs for each geometry type. For example, for a given geometry, the shapes of the geometry are compressed into partitions that have common parameter information, or commonality criteria, describing each shape of the geometry, and unique parameter information, or uniqueness criteria, for the instances of each shape. Thus, the compression process for the pcell produces a partition for each type of geometry that includes the values common to each shape of the geometry listed once, and distinct values unique to each instance of the geometry shape.

An example of a geometry-type partition created by a compression method for a label has common parameters of a shape of the geometry, such as the layer/purpose, text, orientation, font, and height of the label for example, placed into a list. The origin of each label instance is a unique parameter of each instance.

A polygon's sorted geometry partition can have commonality criteria that contains the layer/purpose of a shape, and uniqueness criteria for each shape instance, such as the points of each instance's perimeter.

A partition for a non-rectangular path can have commonality criteria for a shape based on the shape's layer/purpose, width, and style, and the uniqueness criteria for each shape instance represented as a list of centerline points of the path.

A rectangle, or rectangular path, may have a partition including commonality criteria based on the layer/purpose, width and height of each rectangle. The uniqueness criteria for each rectangle instance of a shape may be the lower left corner of the instance. The partitions for the geometries are combined to form the PDQ characteristic value for the pcell.

Figure 2:
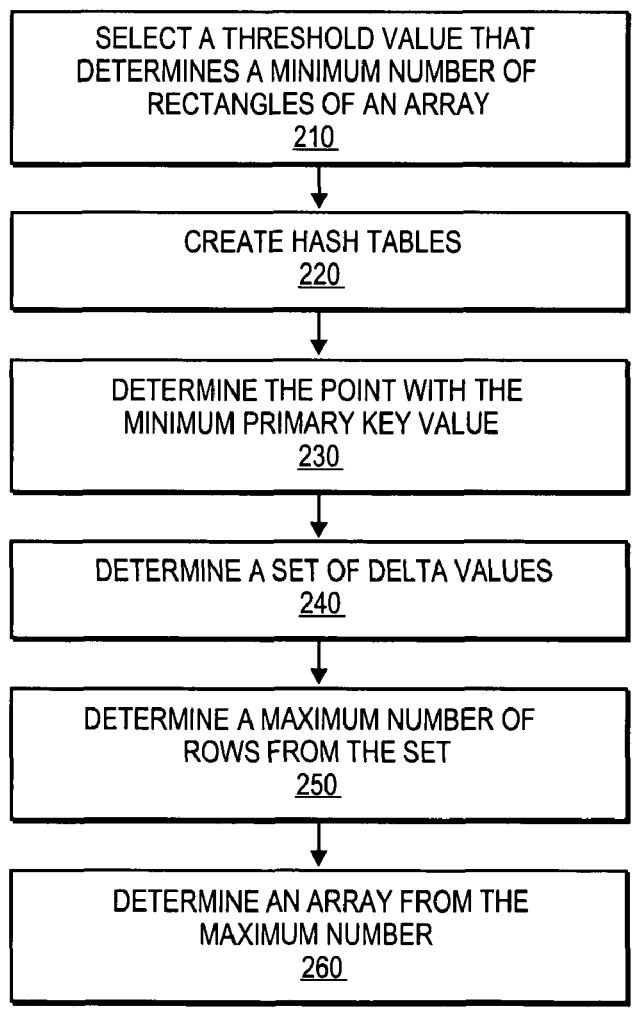
FIG. 2 shows an example of an array recognition method used during the performance of the PDQ creation method.

An example of array recognition method 130 is shown in FIG. 2, and may be used to further compress the amount of data that represents the shapes and instances of the pcell in the PDQ data structure. Each geometry may be partitioned into arrays if the number of instances exceeds a threshold value. This method examines a large list of instances of a shape, such a rectangle for example, and groups them into an array. For the rectangle, the array may be characterized by information for: the x and y coordinate of lower left hand corner of the array; the x (column) and y (row) pitch within the array; the x (width) and y (height) of the rectangle which is arrayed; and the number of rows and columns of rectangles contained in the array. The array recognition method is useful because an array of shapes can usually be drawn much faster than the individual shapes, the characterizing information can be stored in a much smaller amount of memory, and that smaller amount of storage space results in much faster parsing at decoding time.

As shown in FIG. 2, a threshold value is selected to determine a minimum number of rectangles of an array, 210. The value of threshold may be 0, or any positive integer. For example, with a threshold of 0, arrays may be created that contain one or more shape instances. With a threshold of one, an array may be created if two or more instances of a shape are recognized.

In an encoded partition for rectangles, each instance of a rectangle shape shares commonality criteria, such as length and width, for example. Each instance of the shape may be uniquely identified by one of its boundary points, such as its lower left coordinate for example. The list of commonality criteria and unique points may be sorted with a primary key such as x coordinate values, and secondary key, such as y coordinate values.

To recognize an array of rectangles, hash tables are created, 220. A primary key hash table is created to map each primary key, such as the x coordinate, to the list of points having that primary key. Each list of points is in increasing order by secondary key. A secondary key hash table is built to map each secondary key to the list of points having that secondary key. Each list of points in the secondary hash table is in increasing order by primary key.

The point with the minimum primary key value is determined, 230, which in this example is the minimum x coordinate, from the primary key hash table. If multiple points have the minimum primary key value, then a point with the minimum secondary key value is selected from this group of multiple points. This point can be determined by examining value of this x coordinate in the primary hash table. This point is the starting point of the array.

A set of delta values, such as delta x and delta y values for example, is determined, 240, from the primary and secondary hash tables. The set of possible values may be obtained by subtracting the x and y coordinates of the starting point with the x coordinates and y coordinates in the hash tables.

A maximum number of rows of rectangles is determined from the set, 250. For example, for the set of values of (delta_x delta_y rows cols) which make the following statements (1) through (4) true, choose the one which has the maximum value of rows*cols. If more than one have the same maximum value of rows*cols, then choose the one with the maximum value of rows.

$$0<\text{rows}<=\text{number of distinct } y \text{ values} \quad (1)$$

$$0<\text{cols}<=\text{number of distinct } x \text{ values} \quad (2)$$

The vector sum start_$pt+c$*(0 delta_$y$)+$r$*(delta_ $x$0) is a point in the set, for all integers $r$ and $c$, $0<=r<\text{rows}$ AND $0<=c<\text{cols}$ (3)

$$\text{rows*cols}>\text{threshold} \quad (4)$$

If more than one such (delta_x delta_y rows cols) exists, with the same maximum product rows*cols, then one with the minimum delta_x is chosen. If that is still not unique, then the one of those with the minimum delta_y is chosen.

If no such (delta_x delta_y rows cols) exists, then the starting point is an individual rectangle, and no array is formed.

If (delta_x delta_y rows cols) exists, then an array is determined, 260, and the points from the primary and secondary hash tables, which correspond to points in this array, are removed from the hash tables. (This may remove a particular x coordinate or y coordinate from the hash tables).

The method returns to block 250 until no additional array is recognized.

Example of Generating a Characteristic Value with an Array Recognition Method

Figure 3:
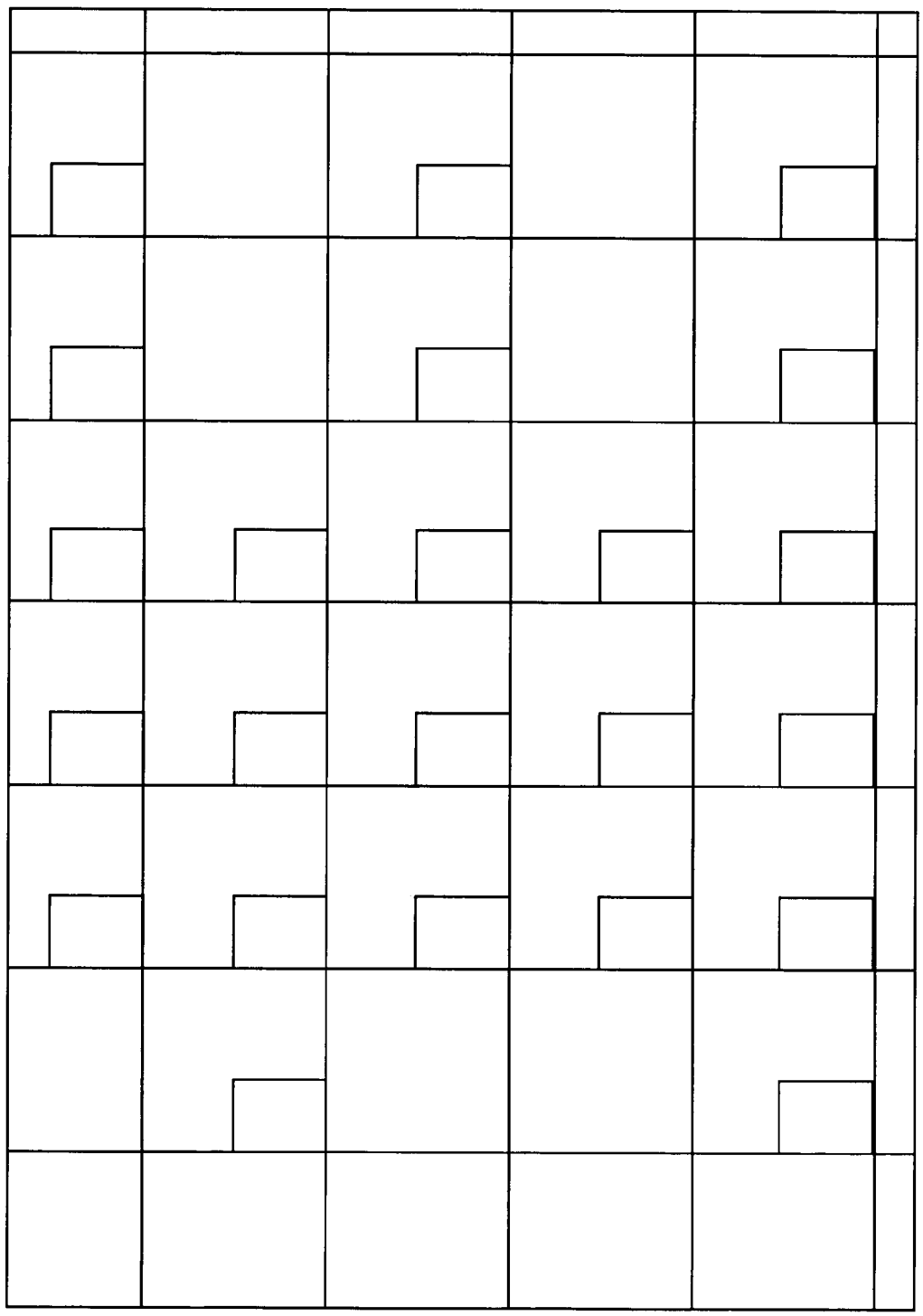
FIGS. 3 through 7 show examples of arrays recognized during the performance of the array recognition method.

Table 3 shows an example of a list of points that represent rectangle instances as shown in FIG. 3. In this example, the rectangle instances have the same shape, which is a width of 0.4 and a height of 0.5, and are placed onto a 1 by 1 grid.

TABLE 3

| ( | (10 10) | (11 10) | (12 10) | (13 10) | (14 10) | (15 10) |
|---|---------|---------|---------|---------|---------|---------|
|   |         | (11 11) | (12 11) | (13 11) |         |         |
|   |         | (11 12) | (12 12) | (13 12) | (14 12) | (15 12) |
|   | (10 13) | (11 13) | (12 13) | (13 13) |         |         |
|   |         | (11 14) | (12 14) | (13 14) | (14 14) | (15 14) |
| ) |         |         |         |         |         |         |

The array method identifies the following arrays:

Pass 1: (start_pt=(10 10) delta_x=1 delta_y=3 rows=2 cols=4).

Pass 2: (start_pt=(11 11) delta_x=1 delta_y=1 rows=2 cols=3).

Pass 3: (start_pt=(11 14) delta_x=1 delta_y=0 rows=1 cols=5).

Pass 4: (start_pt=(14 10) delta_x=1 delta_y=2 rows=2 cols=2).

Figure 4:
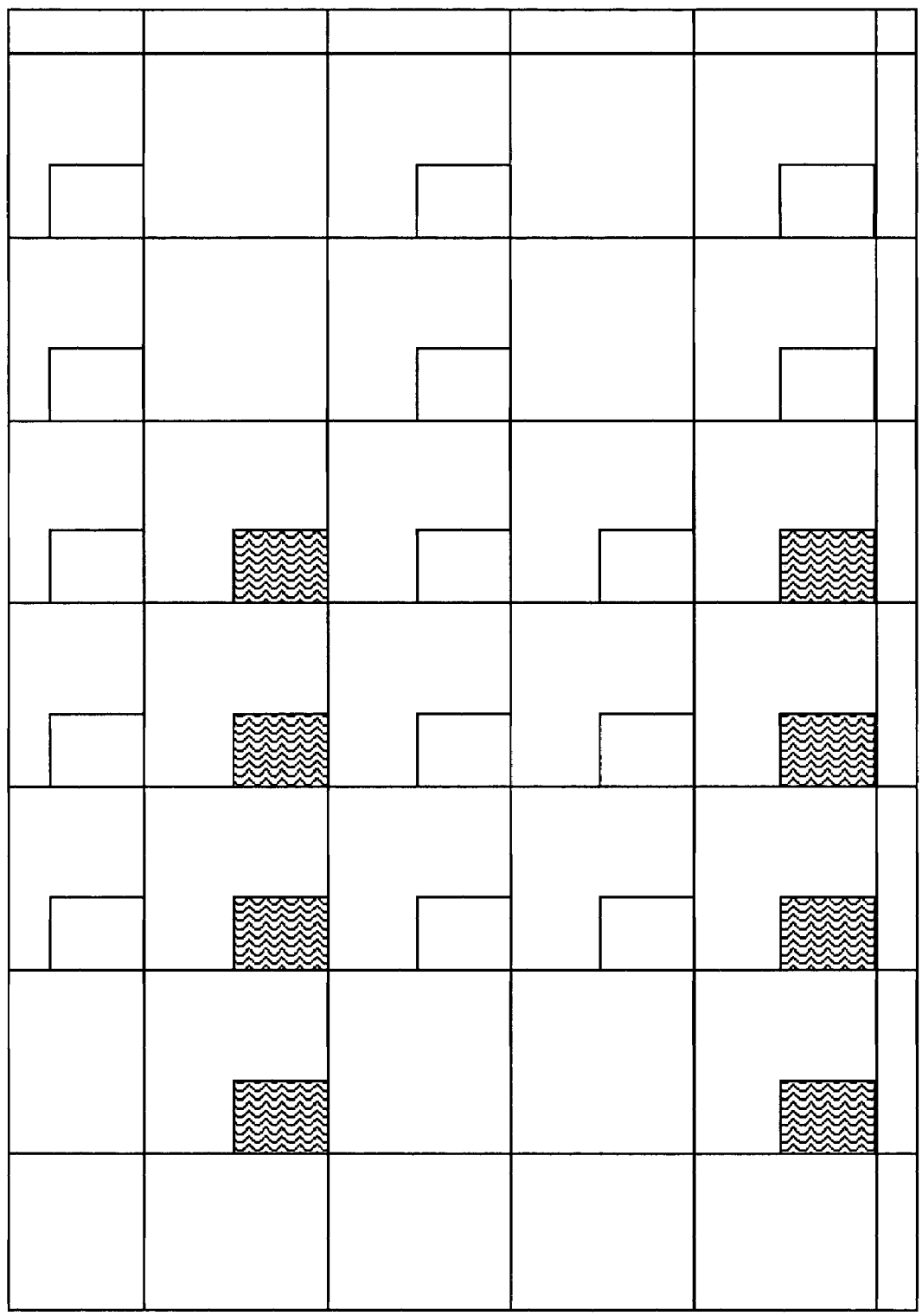

The first pass identifies (start_pt=(10 10) delta_x=1 delta_y=3 rows=2 cols=4), which is represented by the shaded rectangles shown in FIG. 4. (There are other possible arrays to form with the same lower left hand rectangle, but none that group more than eight rectangles.) These shapes are eliminated before the next pass is done.

Figure 5:
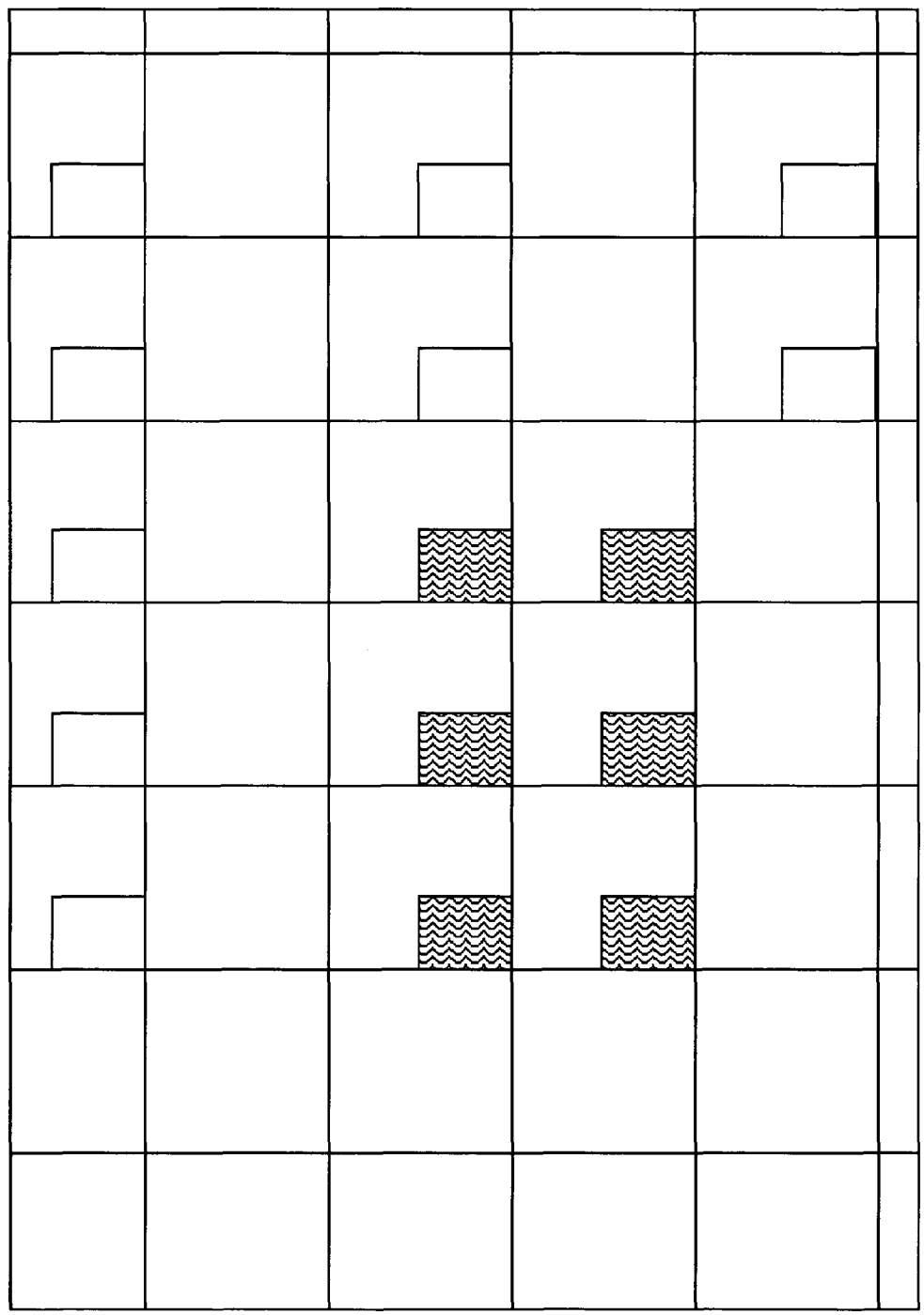

The second pass identifies the rectangular array structure (start_pt=(11 11) delta_x=1 delta_y=1 rows=2 cols=3), as shown with the shaded rectangle instances in FIG. 5. There are two ways of grouping six rectangles starting with (11 11): one with delta_y=1 and the other with delta_y=3. To solve ambiguous situations deterministically, the selected group is the one with the minimum delta_y.

Figure 6:
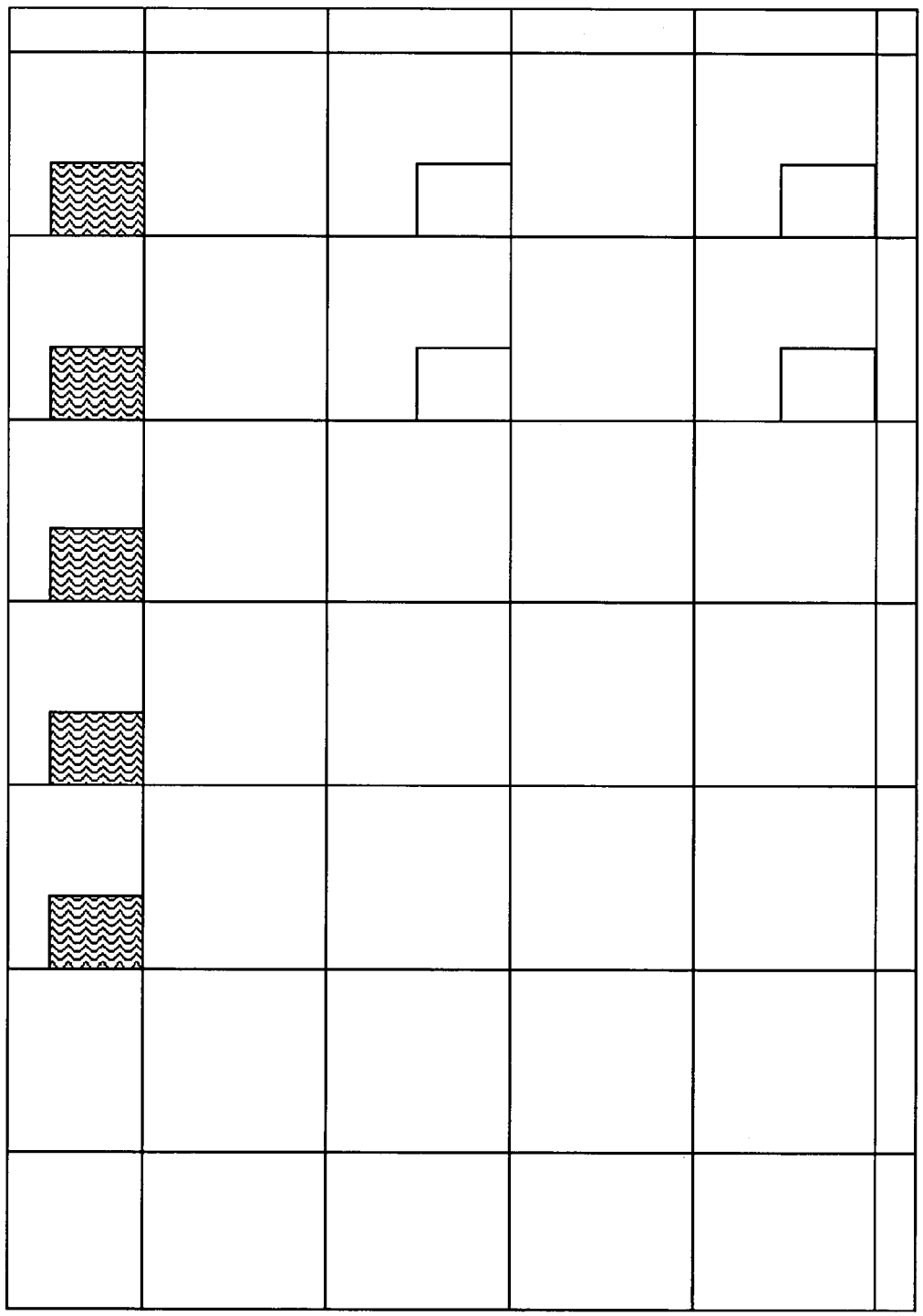

The third pass identifies (start_pt=(11 14) delta_x=1 delta_y=0 rows=1 cols=5), as shown in FIG. 6. These shape instances are eliminated before the next pass is done.

Figure 7:
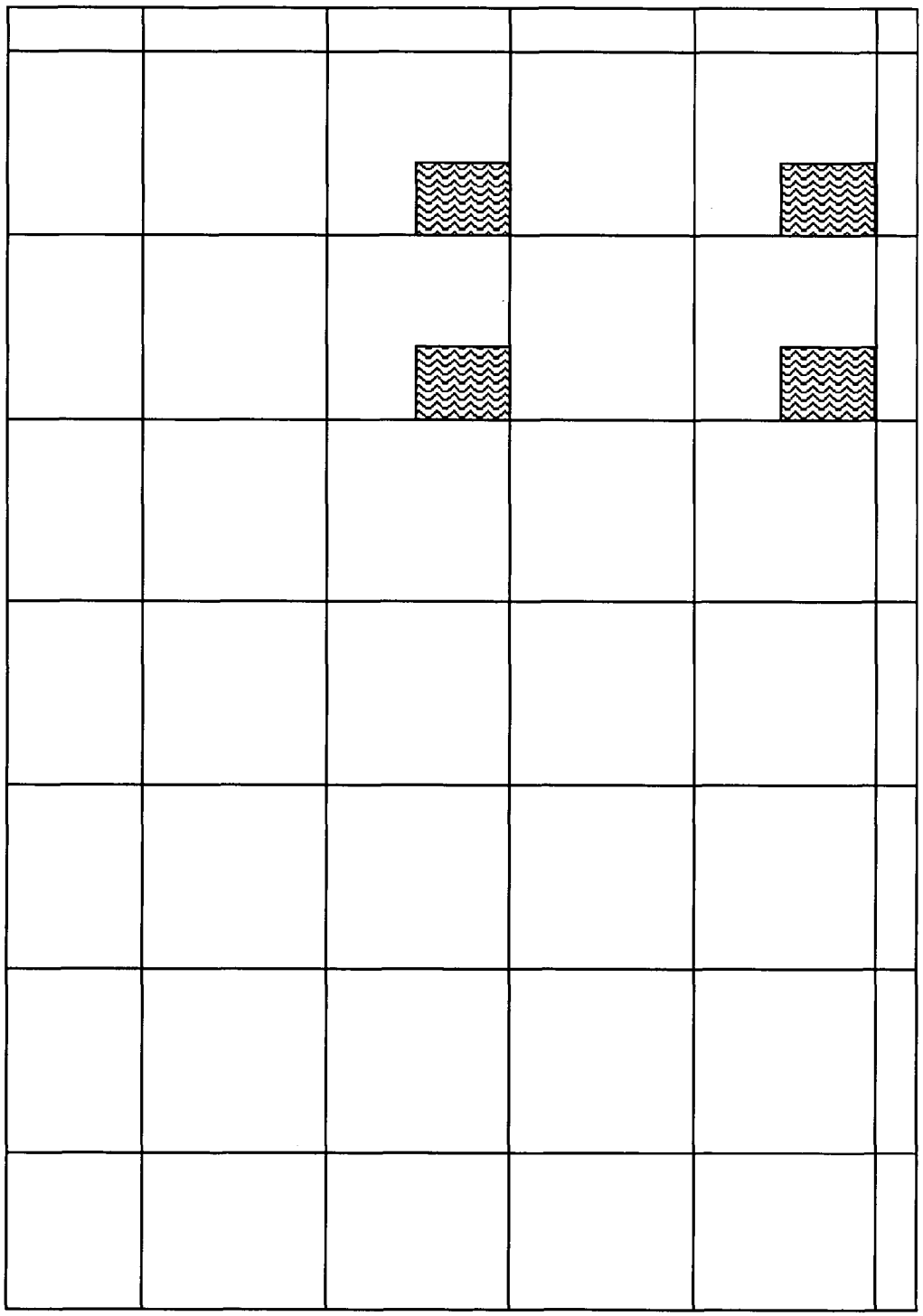

The fourth (and in this case final) pass identifies (start_pt= (14 10) delta_x=1 delta_y=2 rows=2 cols=2), as shown in FIG. 7. The array partition for the pcell of FIG. 3 is then generated based on the arrays recognized in FIGS. 4 through 7.

Shape Drawing and Decoding Method

The method to create the pcell contents, given a PDQ Characteristic Value, uses the pcell design system's built-in functions to draw rectangles, paths, polygons, labels, and arrays of rectangles. The system decodes the parameters from the characteristic value to draw the shapes of the pcell by using the shape parameters from the PDQ characteristic value as input values for the pcell drawing functions. These functions can include dbCreateRect, dbCreatePath, dbCreatePolygon, dbCreateLabel, and dbCreateViaShapeArray, for example, which are part of the Cadence pcell design tool. (If the pcell design system does not provide a draw-array function, it can be implemented programmatically with concurrent loops around the draw-rectangle function).

Figure 8:
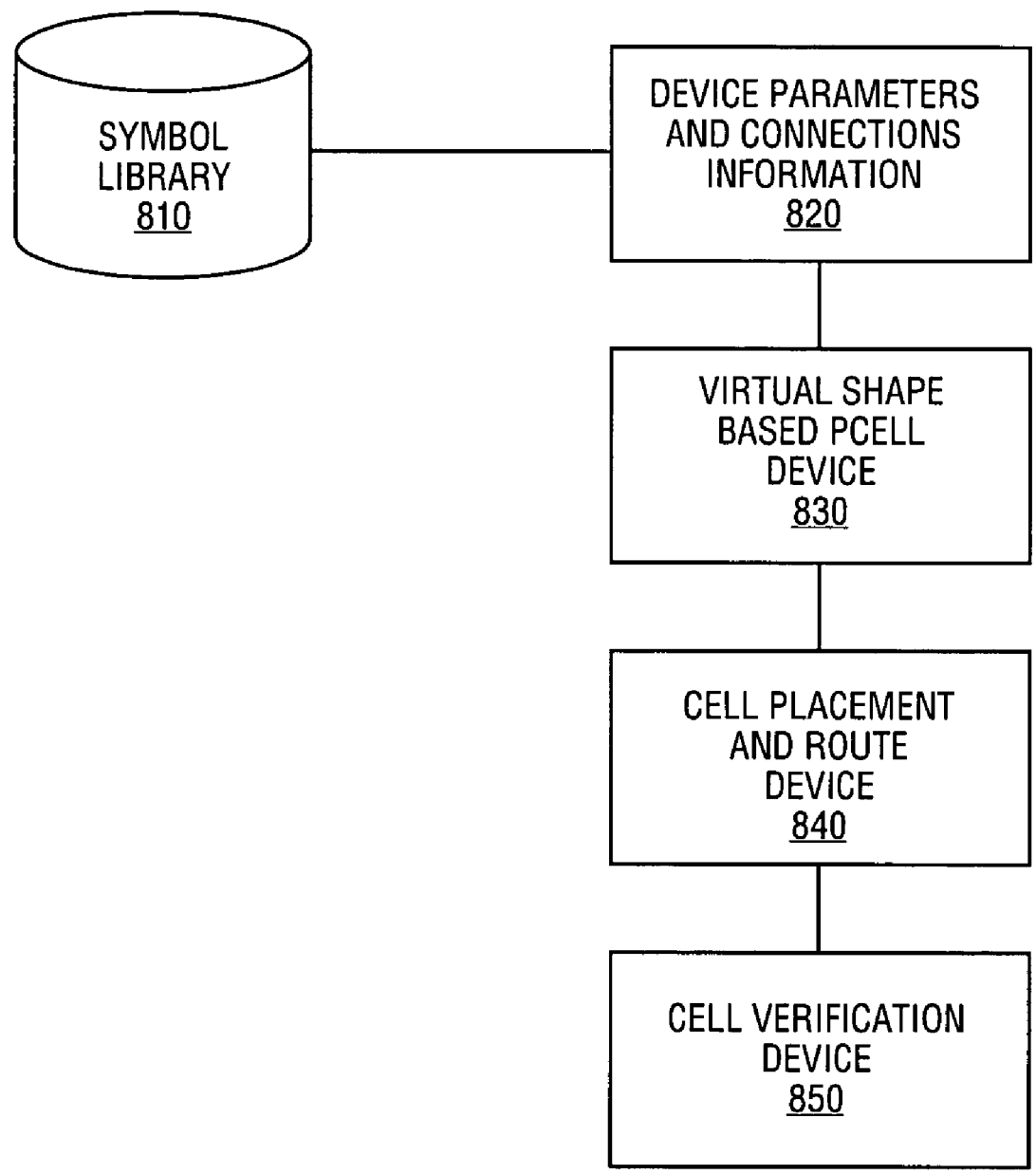
FIG. 8 shows an example of a system to automatically generate and verify a design for an electronic circuit using virtual shapes.

A design of an electronic circuit may include schematic symbols to provide a model for transistor-level simulation. With PDQ based pcells, the schematic design information, which is in electronic form, can be passed seamlessly through to the physical design tools as shown in FIG. 8. Device parameters and connectivity data 820 are applied to symbols from symbol library 810 by the PDQ pcell device 830 to generate a schematic design of the electronic circuit. The PDQ pcell device 830 generates the components of the design using PDQ values with pcells. A cell placement and route device 840 accesses the pcells to edit the layout and to route the components of the design. A cell verification device then applies verification rules to the design to determine whether the design is functional 850.

The method of designing the electronic circuit using PDQ characteristic values for pcells may be performed by executing a computer software program. The software program may be stored in a computer readable medium, such as an electronic memory device for example. The program may be executed by a computer processing system, such as a microprocessing device, for example. The processing system may include devices found in a computing system, such as input/output devices, internal and external communication devices and buses, and power source devices, for example.

The processing system may be implemented with hardware logic, or a combination of hardware and software.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A method for encoding elements of an electronic design, comprising:
   generating a flattened hierarchy of a parameterized cell of the electronic design;
   selecting common and unique parameters of elements in the parameterized cell;
   recognizing one or more arrays in the flattened hierarchy, wherein an array comprises multiple instances of a shape, wherein recognizing one or more arrays further comprises:
      determining delta values for the instances of the shape based on a distance from one instance to a neighboring instance; and
      determining instances that share delta values;
   generating and storing a physical design quantization characteristic value from the selected common and unique parameters.

2. The method of claim 1, wherein selecting common and unique parameters of elements further comprises:
   identifying multiple instances of a shape;
   identifying parameters common to instances of the shape; and
   identifying parameters unique to instances of the shape.

3. The method of claim 2, wherein generating the characteristic value comprises:
   storing the common parameters in a field of a data structure associated with an instance of the shape; and
   storing the unique parameters in a field of the data structure associated with the instance.

4. The method of claim 1, wherein selected common and unique parameters of an element comprise layer, purpose, text, orientation, font and height.

5. The method of claim 1, wherein the delta values are stored in a hash table.

6. The method of claim 1, further comprising:
   decoding the parameters in the characteristic value to draw the shapes of the parameterized cell.

7. An apparatus for encoding elements of an electronic design, comprising:
   means for generating a flattened hierarchy of a parameterized cell of the electronic design;
   means for selecting common and unique parameters of elements in the parameterized cell;
   means for recognizing one or more arrays in the flattened hierarchy, wherein an array comprises multiple instances of a shape, wherein the means for recognizing one or more arrays comprises:
      means for determining delta values for the instances of the shape based on a distance from one instance to a neighboring instance; and
      means for determining instances that share delta values;
   means for generating and storing a physical design quantization characteristic value from the selected common and unique parameters.

8. The apparatus of claim 7, wherein said means for selecting common and unique parameters of elements further comprises:
   means for identifying multiple instances of a shape;
   means for identifying parameters common to instances of the shape; and
   means for identifying parameters unique to instances of the shape.

9. The apparatus of claim 8, wherein said means for generating the characteristic value comprises:
   means for storing the common parameters in a field of a data structure associated with an instance of the shape; and
   means for storing the unique parameters in a field of the data structure associated with the instance.

10. The apparatus of claim 7, wherein selected common and unique parameters of an element comprise layer, purpose, text, orientation, font and height.

11. The apparatus of claim 7, wherein the delta values are stored in a hash table.

12. The apparatus of claim 7, further comprising:
   means for decoding the parameters in the characteristic value to draw the shapes of the parameterized cell.

13. A computer readable medium comprising instructions which, when executed by a computer processing system, cause the system to perform a method for encoding elements of an electronic design, the method comprising:
   generating a flattened hierarchy of a parameterized cell of the electronic design;
   selecting common and unique parameters of elements in the parameterized cell;
   recognizing one or more arrays in the flattened hierarchy, wherein an array comprises multiple instances of a shape, wherein recognizing one or more arrays comprises:
      determining delta values for the instances of the shape based on a distance from one instance to a neighboring instance; and
      determining instances that share delta values;
   generating and storing a physical design quantization characteristic value from the selected common and unique parameters.

14. The computer readable medium of claim 13, wherein the instructions, when executed, cause the system to perform the method of selecting common and unique parameters of elements, the selecting comprising:
   identifying multiple instances of a shape;
   identifying parameters common to instances of the shape; and
   identifying parameters unique to instances of the shape.

15. The computer readable medium of claim 14, wherein the instructions, when executed, cause the system to perform the generating the characteristic value, the generating the characteristic value comprising:
   storing the common parameters in a field of a data structure associated with an instance of the shape; and
   storing the unique parameters in a field of the data structure associated with the instance.

16. The computer readable medium of claim 13, wherein selected common and unique parameters of an element comprise layer, purpose, text, orientation, font and height.

17. The computer readable medium of claim 13, wherein the delta values are stored in a hash table.

18. The computer readable medium of claim 13, wherein the method further comprises:
   decoding the parameters in the characteristic value to draw the shapes of the parameterized cell.

* * * * *